(12) United States Patent
Brenninger et al.

(10) Patent No.: US 9,828,693 B2
(45) Date of Patent: Nov. 28, 2017

(54) APPARATUS AND PROCESS FOR PRODUCING A CRYSTAL OF SEMICONDUCTOR MATERIAL

(71) Applicant: SILTRONIC AG, Munich (DE)

(72) Inventors: Georg Brenninger, Oberbergkirchen (DE); Georg Raming, Tann (DE)

(73) Assignee: SILTRONIC AG, Munich (DE)

( * ) Notice: Subject to any disclaimer, the term of this patent is extended or adjusted under 35 U.S.C. 154(b) by 84 days.

(21) Appl. No.: 14/711,942

(22) Filed: May 14, 2015

(65) Prior Publication Data

US 2015/0354087 A1    Dec. 10, 2015

(30) Foreign Application Priority Data

Jun. 6, 2014    (DE) .................. 10 2014 210 936

(51) Int. Cl.
| | | |
|---|---|---|
| *C30B 13/08* | (2006.01) | |
| *C30B 13/20* | (2006.01) | |
| *C30B 11/00* | (2006.01) | |
| *C30B 13/14* | (2006.01) | |
| *C30B 13/30* | (2006.01) | |
| *C30B 29/06* | (2006.01) | |
| *C30B 11/10* | (2006.01) | |

(Continued)

(52) U.S. Cl.
CPC ............ *C30B 13/20* (2013.01); *C30B 11/001* (2013.01); *C30B 11/003* (2013.01); *C30B 11/10* (2013.01); *C30B 13/08* (2013.01); *C30B 13/14* (2013.01); *C30B 13/30* (2013.01); *C30B 29/06* (2013.01); *C30B 15/02* (2013.01); *C30B 15/12* (2013.01); *Y10T 117/108* (2015.01)

(58) Field of Classification Search
CPC ....... C30B 29/06; C30B 13/08; C30B 11/001; C30B 13/14; C30B 15/02; C30B 15/12
See application file for complete search history.

(56) References Cited

U.S. PATENT DOCUMENTS

| | | |
|---|---|---|
| 5,367,981 A | 11/1994 | Maruyama |
| 6,072,118 A * | 6/2000 | Fukuda .................. C30B 15/08 136/258 |

(Continued)

FOREIGN PATENT DOCUMENTS

| | | |
|---|---|---|
| DE | 102 04 178 A1 | 9/2003 |
| DE | 10 2008 013 326 B4 | 3/2013 |

(Continued)

*Primary Examiner* — Matthew Song
(74) *Attorney, Agent, or Firm* — Brooks Kushman P.C.

(57) ABSTRACT

A crystal of semiconductor material is produced in an apparatus having a crucible with a crucible bottom and a crucible wall, the crucible bottom having a top surface, an underside, and a multitude of openings disposed between the crucible wall and a center of the crucible bottom, and elevations disposed on the top surface and the underside of the crucible bottom; and an induction heating coil disposed below the crucible for melting semiconductor material and stabilizing a melt of semiconductor material covering a growing crystal of semiconductor material. The growth process comprises generating a bed of a semiconductor material feed on the top surface of the crucible bottom and melting semiconductor material on the bed using the induction heating coil.

20 Claims, 1 Drawing Sheet

(51) Int. Cl.
C30B 15/12 (2006.01)
C30B 15/02 (2006.01)

(56) References Cited

U.S. PATENT DOCUMENTS

| | | | |
|---|---|---|---|
| 6,423,137 B1 * | 7/2002 | Takase | C30B 15/02 117/214 |
| 2003/0145781 A1 * | 8/2003 | Von Ammon | C30B 13/08 117/49 |
| 2005/0188918 A1 * | 9/2005 | Abrosimov | C30B 13/20 117/200 |
| 2009/0223949 A1 | 9/2009 | Altmannshofer et al. | |
| 2011/0095018 A1 | 4/2011 | von Ammon et al. | |

FOREIGN PATENT DOCUMENTS

| | | |
|---|---|---|
| EP | 2 319 961 A1 | 5/2011 |
| EP | 2 679 706 A1 | 1/2014 |
| EP | 2 692 908 A1 | 2/2014 |
| JP | 11292682 A | 10/1999 |
| JP | 2010070404 A | 4/2010 |

* cited by examiner

APPARATUS AND PROCESS FOR PRODUCING A CRYSTAL OF SEMICONDUCTOR MATERIAL

CROSS-REFERENCE TO RELATED APPLICATIONS

This application claims priority to German Patent Application No. DE 102014210936.1 filed Jun. 6, 2014 which is herein incorporated by reference.

BACKGROUND OF THE INVENTION

1. Field of the Invention

The invention relates to an apparatus and a process for producing a crystal of semiconductor material. The apparatus comprises a crucible and an induction heating coil provided for melting a feed of semiconductor material and for stabilizing a melt of semiconductor material covering a growing crystal of semiconductor material.

2. Description of the Related Art

There is a requirement for large amounts of semiconductor material, particularly silicon, in crystalline form for the production of electronic components or solar cells. The crystals are available in monocrystalline or polycrystalline grades of circular, rectangular or square cross section. The production of crystals having a non-circular cross section is described, inter alia, in US 2005/0188918 A1 and EP 2692908 A1.

Monocrystals of circular cross section are produced on an industrial scale using, in particular, the CZ process and the FZ process. The CZ process comprises pulling a monocrystal growing from a seed crystal, out of a melt contained in a crucible. The melt is generated by filling the crucible with chunks of semiconductor material and melting the chunks using a resistance heating means disposed around the crucible.

The FZ process comprises using an induction heating coil to generate a zone of molten semiconductor material between a seed crystal and a feed rod. The induction heating coil is a flat coil comprising a coil body which is configured to have a hole in the middle, the hole having a specified diameter. Lowering of the seed crystal and feed rod causes the melt zone to move into the feed rod, and semiconductor material melted from the feed rod crystallizes on the seed crystal. A neck section is initially allowed to crystallize to obtain dislocation-free semiconductor material. A monocrystal of semiconductor material subsequently grows to form a cone-shaped section with increasing diameter and ultimately to form a cylindrical section of approximately constant diameter. The FZ process is described in detail in EP 2 679 706 A1 for example.

There are also descriptions of processes similar to the FZ process but differing in that they employ a feed of semiconductor material granules instead of a solid rod. A representative example of such processes is U.S. Pat. No. 5,367,981 which describes the production of monocrystals and polycrystals. It has not yet proved possible to employ any of these processes on an industrial scale. One reason for this is the difficulty of controlling the transport of the melt out of the crucible.

SUMMARY OF THE INVENTION

An object of the present invention is to overcome the aforementioned problems and to provide an apparatus and a process having a greater potential for use in producing crystals from semiconductor material on an industrial scale. These and other objects are achieved by an apparatus for producing a crystal of semiconductor material, comprising a crucible comprising a crucible bottom and a crucible wall, wherein the crucible bottom has a top surface and an underside and a multitude of openings disposed between the crucible wall and a center of the crucible bottom and wherein there are elevations disposed on the top surface and the underside of the crucible bottom; and an induction heating coil which is disposed below the crucible and is provided for melting semiconductor material and stabilizing a melt of semiconductor material covering a growing crystal of semiconductor material.

The invention further relates to a process for producing a crystal of semiconductor material, comprising providing the abovementioned apparatus;

generating a bed of a semiconductor material feed on the top surface of the crucible bottom;

melting the semiconductor material of the bed using the induction heating coil and channelling the molten semiconductor material from the top surface of the crucible bottom through the openings in the crucible bottom to the underside of the crucible bottom, passing underneath the elevations on the underside of the crucible bottom, to a melt which covers a growing crystal of semiconductor material and is a region of a melt zone.

DETAILED DESCRIPTION OF THE PREFERRED EMBODIMENT(S)

Figure 1:
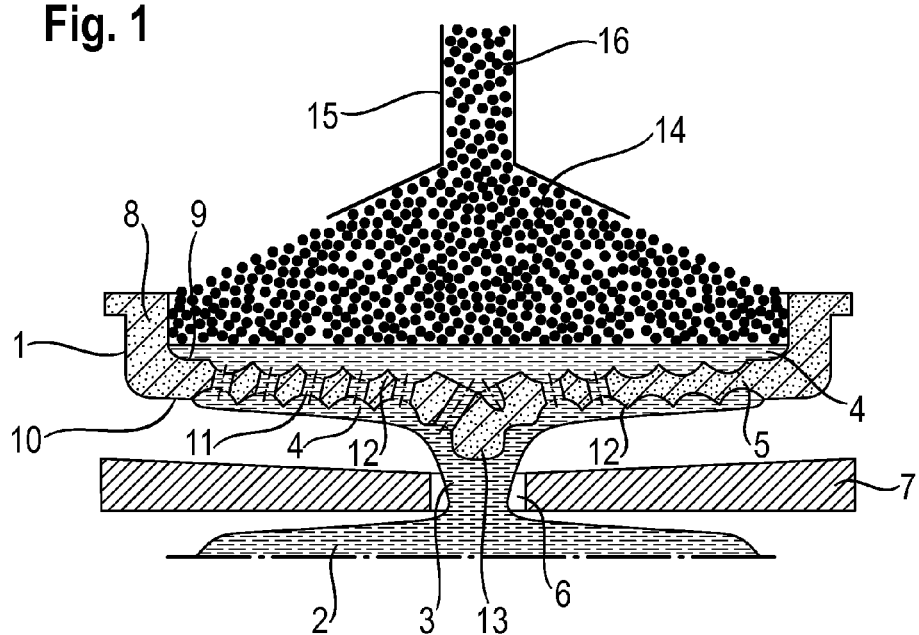
FIG. 1 shows a schematic sectional illustration of one embodiment of an apparatus of the invention.

The process is designed such that it very closely resembles the FZ process. Problems arising from differences compared to the FZ process are thus insignificant. The shape and constitution of the crucible play a particular role here. For instance there are no components of the crucible projecting into the hole in the middle of the induction heating coil or into the region of the melt zone disposed below the induction heating coil and covering the growing crystal. Molten semiconductor material from the feed flows to the phase boundary, where the crystal grows, taking a path similar to that taken when the feed employed is a feed rod. In addition, the feed is provided in such a way that dusting is eliminated and melt zone vibration and molten semiconductor material spray are avoided. The crucible employed can be reused without first requiring costly and inconvenient maintenance.

Useful semiconductor materials include, in particular, silicon or germanium or mixtures thereof. It is particularly preferable that the semiconductor material is silicon. The semiconductor material is preferably employed in the form of granules or chunks or in the form of a mixture of granules and chunks. The granules preferably have an average diameter of not less than 0.2 mm and not more than 30 mm. It is nevertheless also possible to melt smaller particles of the semiconductor material, for example semiconductor material dust, together with granules or chunks.

The crystal produced in accordance with the invention is preferably a monocrystal or a polycrystalline crystal (polycrystal). Particular preference is given to a monocrystal of silicon. The crystal produced in accordance with the invention is of circular, rectangular or square cross section. The cross section shape depends essentially on whether the growing crystal is turned or not. When the growing crystal is rotated as is customary in the FZ process, a crystal of circular cross section, which can be monocrystalline or polycrystalline, is formed. When rotation is omitted, it is also possible to produce crystals of rectangular or square cross section, for example by crystallizing molten semiconductor material as described in U.S. 2005/0188918 A1 or in EP 2692908 A1.

The crucible has a crucible bottom with a preferably circular circumference bounded by a crucible wall. The diameter of the crucible bottom is preferably greater than the diameter of the hole in the middle of the induction heating coil. The crucible bottom is provided with a multitude of openings. The openings are preferably of circular cross section. The openings can pass through the crucible bottom vertically or at an incline. In the case of inclined passage through the crucible, preference is given to an inclined attitude where, in a downward direction, the distance between the vertical axes of the openings and the vertical axis of the growing crystal increases with increasing distance from the crucible bottom. When the openings are of circular cross section, the diameter of the openings is preferably not less than 0.5 mm and not more than 15 mm, more preferably not less than 0.5 mm and not more than 6 mm.

The crucible bottom has a top surface and an underside and there are elevations on the top surface and the underside. Elevations are rises of the material which project upwards on the top surface and downwards on the underside. Due to the elevations, the top surface and the underside of the crucible are structured rather than level. The openings are preferably disposed between the elevations. The elevations preferably extend along trajectories which do not cross and which form circular or spiral patterns. Particular preference is given to elevations disposed along trajectories forming a pattern of concentric circles around the center of the crucible bottom. Also suitable, however, are trajectories which cross and which form rhombic or chequered patterns for example. It is further preferred when the middles of adjacent elevations disposed along trajectories which do not cross have a distance between them of preferably not less than 2 mm and not more than 15 mm, more preferably not less than 3 mm and not more than 6 mm. The height difference between the highest point of an elevation and the edge of an adjacent opening is preferably not less than 0.1 mm and not more than 5 mm, more preferably not less than 0.5 mm and not more than 3 mm.

There is preferably an incline between elevations at the outer edge of the top surface and the underside of the crucible bottom and corresponding elevations which are radially closer to the center of the crucible bottom. The incline has an angle of inclination of preferably not less than 1° and not more than 45°, more preferably not less than 1° and not more than 15°.

It is preferable to have, on the underside of the crucible bottom and in its center, a projection which projects downwards and is disposed above the hole in the middle of the induction heating coil. The projection can have the external shape of a droplet, for example.

The top surface and the underside of the crucible bottom and preferably all other surfaces of the crucible consist of a ceramic material which is thermally stable on contact with liquid semiconductor material and which causes very little contamination of the liquid semiconductor material with impurities. The crucible can consist of a base structure coated with the ceramic material. The crucible can also consist entirely of the ceramic material. Possible materials of construction for the base structure are fracture-resistant materials which are of high thermal stability and can be coated with the ceramic material, for example metals and carbon. Particular preference is given to base structures of carbon. The ceramic material is preferably a material such as aluminium oxide ($Al_2O_3$), boron nitride (BN), lanthanum hexaboride ($LaB_6$), silicon carbide (SiC), silicon nitride ($Si_3N_4$), yttrium oxide ($Y_2O_3$), zirconium oxide ($ZrO_2$) or quartz ($SiO_2$). Particular preference is given to silicon carbide.

The invention is more particularly described with reference to the example of producing a monocrystal of silicon having a circular cross section.

The feed employed is silicon in the form of granules or in the form of chunks or in the form of a mixture of granules and chunks. Granules are, in particular, grains of polycrystalline silicon generated in a fluidized bed. The granules preferably have an average diameter of not less than 0.2 mm and not more than 30 mm. Chunks are obtainable by comminution of, for example, rods of polycrystalline silicon. The chunks preferably have a maximum longitudinal extent of not less than 0.2 mm and not more than 30 mm. The feed is provided in the form of a bed in the crucible. The bed is preferably supplemented with a further amount of feed. The supplemented amount preferably corresponds to the amount of the bed that is melted to maintain the growth of the monocrystal. The amount to be supplemented is preferably provided by allowing further feed to flow down to the bed. The feed and the further feed can comprise not only silicon but also one or more electrically active dopants.

The inventors have found that the elevations are necessary to facilitate the transport of liquid silicon. Omission of the elevations impairs the transport of liquid silicon. The reason for this is the modest wettability of the material of the crucible bottom by liquid silicon. Using a flat crucible bottom results in the formation of slow-moving islands of liquid silicon showing barely any inclination to flow. The structuring of the top surface and underside of the crucible bottom distinctly improves the flow behavior of liquid silicon. Island formation is no longer observed. On the top surface, molten silicon flows through the openings and also over the elevations. The proportion of molten silicon which reaches the underside of the crucible bottom and which is at a relatively large radial distance from the center of the crucible bottom flows inwards, initially held in proximity to the crucible bottom by surface tension, passing underneath the elevations, to reach the projection in the center of the underside of the crucible bottom and into the region of the melt zone, also known, on account of the reduced diameter of the melt zone in this region, as the melt zone neck.

The way in which molten material arrives in the melt zone neck does not fundamentally differ from the FZ process. The underside of the crucible bottom and the bottom end side of a feed rod are very similar. Both surfaces have a comparable topography and molten silicon flowing over these surfaces to the melt zone neck thus exhibits similar behavior.

The bed of feed on the top surface of the crucible bottom is preferably generated before the melt zone is formed. Particular preference is given to mounding the feed on the top surface to form a conical bed. The bed is replenished with further feed as necessary, preferably by allowing further feed to flow down to the bed. For this purpose, a pipe filled with further feed is held against the bed and the further feed can therefore arrive at the bed without having to overcome a free-fall distance.

The monocrystal is produced by rotating the crucible while the pipe containing further feed for replenishment preferably remains stationary. The sense of rotation of the crucible rotation can match the sense of rotation in which the growing monocrystal is being rotated. The crucible and the monocrystal can also be counter-rotated. It is further possible to provide for alternating rotation of the monocrystal or of the monocrystal and the crucible. Alternating rotation comprises reversing the sense of rotation at time intervals.

When a crucible is used for the first time, care is taken to ensure that, when generating the bed on the top surface of the crucible bottom, the openings are blocked by feed. This is advantageously achieved by ensuring that at least a first layer of the bed with which the crucible bottom is covered consists of granules or chunks too large to be able to fall through the openings. Such a measure is not necessary when reusing a used crucible because the openings are already blocked by solidified residual melt.

The induction heating coil disposed below the crucible is used to gradually melt feed from the bed. The feed can be doped with electrically active dopants in order to increase its electrical conductivity.

Silicon is initially melted to get the crystallization of a monocrystal under way. Molten silicon collects at the projection which projects downwards from the center of the underside of the crucible bottom. The seed crystal is contacted therewith and the neck section crystallizes. The amount of silicon required therefor and for crystallization of the monocrystal growing on the neck section is melted gradually from the feed, which is disposed on the top surface of the crucible bottom as a bed, using the induction heating coil. The volume of the bed remains approximately constant because, to compensate, further feed flows out of the tube to replenish the bed. When the cylindrical section of the growing monocrystal has reached a desired length, another, cone-shaped end section is allowed to crystallize. Once the induction heating coil has been switched off and the monocrystal removed, molten silicon wetting the top surface and the underside of the crucible bottom solidifies. The crucible is then in a state where it can be reused without first requiring maintenance. Equally, the replenishment with further feed can be interrupted and the growth of the monocrystal ended when the feed on the top surface of the crucible bottom has been essentially exhausted. The crucible is then in a state similar to the unused state.

FIG. 1 shows the apparatus having a crucible 1 of preferred configuration at a point in time where a crystal is growing. The melt zone is made up of a region 2 which covers the growing crystal, a neck region 3 and a region 4 in proximity to the crucible bottom 5. The neck region 3 of the melt zone extends through a hole 6 in the middle of induction heating coil 7. The induction heating coil is disposed between the crucible bottom 5 of the crucible 1 and the region 2 of the melt zone which covers the growing crystal. The crucible 1 consists essentially of the crucible bottom 5 and the crucible wall 8. The crucible bottom 5 has a top surface 9 and an underside 10 and a multitude of openings 11 disposed between the crucible wall 8 and the center of the crucible bottom and passing through the crucible bottom 5. The top surface 9 and the underside 10 of the crucible bottom 5 have elevations 12 disposed on them. The openings 11 are disposed between the elevations 12. In the center of crucible bottom 5 on the underside 10 of the crucible bottom 5 there is disposed a projection 13 which projects downwards. The top surface 9 of the crucible bottom has a feed of solid semiconductor material heaped upon it to form a conical bed 14. Held close to the conical bed 14 there is a device for replenishing with further feed, said device comprising a pipe 15 filled with further feed 16.

Figure 2:
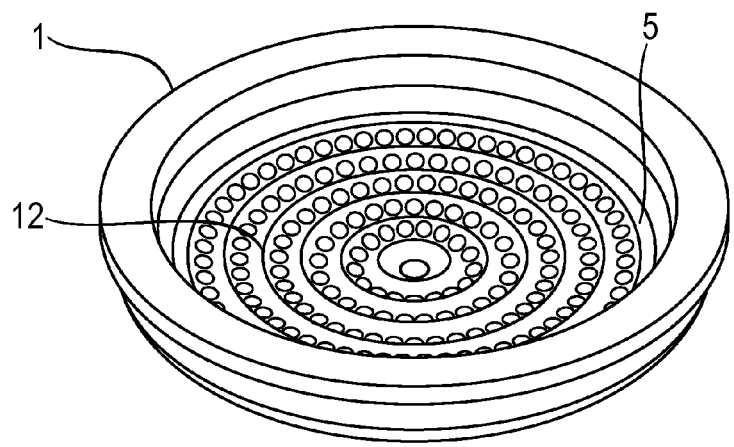
FIG. 2 shows a perspective illustration of the crucible of FIG. 1.

As shown in FIG. 2, crucible 1 has elevations 12 extending along trajectories forming a pattern of concentric circles around the center of the crucible bottom 5. The middles of adjacent elevations 12 have a constant distance between them.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. An apparatus for producing a crystal of semiconductor material, comprising
   a crucible comprising a crucible bottom and a crucible wall, the crucible bottom having a top surface, an underside, a central downward projection and a multitude of openings through the crucible bottom disposed between the crucible wall and a center of the crucible bottom, the openings located between elevations disposed on the top surface and the underside of the crucible bottom; wherein the openings and elevations facilitate a flow of molten semiconductor material from above the crucible to its underside; and
   an induction heating coil for melting semiconductor material and stabilizing a melt of semiconductor material covering a growing crystal of semiconductor material disposed below the crucible, the induction heating coil located below the underside of the crucible bottom and the multiplicity of holes in the crucible bottom, the induction coil having a central hole suitable for enclosing a melt zone of a growing crystal.

2. The apparatus of claim 1, wherein the elevations extend along trajectories forming circular, spiral, rhombic or chequered patterns.

3. The apparatus of claim 2, wherein the middles of adjacent elevations, disposed along trajectories which do not cross, have a distance between them of not less than 2 mm and not more than 15 mm.

4. The apparatus of claim 1, wherein on the underside of the crucible bottom in the center of the crucible bottom the projection which projects downwards is disposed above the central hole of the induction heating coil.

5. The apparatus of claim 2, wherein on the underside of the crucible bottom in the center of the crucible bottom the projection which projects downwards is disposed above the central hole of the induction heating coil.

6. The apparatus of claim 3, wherein on the underside of the crucible bottom in the center of the crucible bottom the projection which projects downwards is disposed above the central hole of the induction heating coil.

7. The apparatus of claim 1, wherein the top surface and the underside of the crucible bottom comprise a ceramic material.

8. A process for producing a crystal of semiconductor material, comprising
   providing an apparatus comprising;
   a crucible having a crucible bottom and a crucible wall, the crucible bottom having a top surface and an underside and a multitude of openings disposed in the crucible bottom between the crucible wall and a center of the crucible bottom; elevations disposed on the top surface and on the underside of the crucible bottom; and an induction heating coil for melting semiconductor material and stabilizing a melt of semiconductor material covering a growing crystal of semiconductor material disposed below the crucible;

generating a bed of a semiconductor material feed on the top surface of the crucible bottom;

melting semiconductor material feed of the bed with the induction heating coil and channelling the molten semiconductor material from the top surface of the crucible bottom through the multitude of openings in the crucible bottom to the underside of the crucible bottom, the molten semiconductor material flowing underneath the elevations on the underside of the crucible bottom, to a melt which covers a growing crystal of semiconductor material and is a region of a melt zone.

9. The process of claim 8, further comprising blocking the openings in the crucible bottom with semiconductor material of the bed or with solidified semiconductor material prior to melting semiconductor material feed of the bed.

10. The process of claim 8, wherein the bed of semiconductor material feed comprises granules of semiconductor material, chunks of semiconductor material, or a mixture of granules and chunks of semiconductor material.

11. The process of claim 8, further comprising replenishing the bed with further feed by allowing further feed to flow down onto the bed.

12. The process of claim 8, wherein the semiconductor material comprises silicon.

13. The process of claim 8, wherein the crystal is monocrystalline or polycrystalline.

14. The process of claim 8, wherein the crystal has a circular, rectangular or square cross section.

15. The process of claim 11, wherein the step of replenishing takes place during crystal growth.

16. The process of claim 8, wherein the elevations have a height difference between the highest point of the elevation and the edge of an adjacent opening of from 0.1 mm to 5 mm.

17. The process of claim 8, wherein the elevations have a height difference between the highest point of the elevation and the edge of an adjacent opening of from 0.5 mm to 3 mm.

18. The process of claim 8, wherein openings of the multitude of openings are located between adjacent concentric elevations in a circular pattern.

19. The process of claim 8, wherein the induction heating coil is in the form of a hollow flat ring, and a melt zone of a growing crystal is within a central opening of the induction coil.

20. The process of claim 8, wherein the apparatus has a central downwardly projecting extension on the underside of the crucible bottom, and the melt zone is located below the central downwardly extending projection.

* * * * *